(12) United States Patent
Ohnishi et al.

(10) Patent No.: US 8,691,143 B2
(45) Date of Patent: Apr. 8, 2014

(54) LEAD-FREE SOLDER ALLOY

(75) Inventors: Tsukasa Ohnishi, Koshigaya (JP); Tokuro Yamaki, Souka (JP); Daisuke Soma, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 307 days.

(21) Appl. No.: 11/920,961

(22) PCT Filed: May 31, 2006

(86) PCT No.: PCT/JP2006/310882
§ 371 (c)(1),
(2), (4) Date: May 4, 2009

(87) PCT Pub. No.: WO2006/129713
PCT Pub. Date: Dec. 7, 2006

(65) Prior Publication Data
US 2009/0232696 A1 Sep. 17, 2009

(30) Foreign Application Priority Data
Jun. 3, 2005 (JP) .................................. 2005-164362

(51) Int. Cl.
*C22C 13/02* (2006.01)
*C22C 13/00* (2006.01)

(52) U.S. Cl.
USPC .......................................... 420/561; 420/560

(58) Field of Classification Search
USPC .................................................. 420/560, 561
See application file for complete search history.

(56) References Cited

U.S. PATENT DOCUMENTS

2004/0262779 A1* 12/2004 Amagai et al. ................. 257/779

FOREIGN PATENT DOCUMENTS

| EP | 1273384 | 1/2003 | | |
|----|---------|--------|---|---|
| EP | 1382413 | 1/2004 | | |
| EP | 1468777 | 10/2004 | | |
| EP | 1679149 | 7/2006 | | |
| EP | 1772225 | 4/2007 | | |
| JP | 10058184 A | * 3/1998 | ............. | B23K 35/26 |
| JP | 2001287082 A | * 10/2001 | ............. | B23K 35/26 |
| JP | 2002239780 | 8/2002 | | |
| JP | 2002246742 | 8/2002 | | |
| JP | 2002307187 | 10/2002 | | |
| JP | 2003094195 | 4/2003 | | |
| JP | 2004261863 | 9/2004 | | |
| JP | 2004330259 | 11/2004 | | |
| JP | 2005040847 | 2/2005 | | |

(Continued)

OTHER PUBLICATIONS

Machine translation of JP 10058184, 1998.*

(Continued)

*Primary Examiner* — Rebecca Lee
(74) *Attorney, Agent, or Firm* — Michael Tobias

(57) ABSTRACT

A lead-free solder alloy is provided which has improved impact resistance to dropping even after thermal aging and which is excellent with respect to solderability, occurrence of voids, and yellowing. A solder alloy according to the present invention consists essentially of, in mass percent, (1) Ag: 0.8-2.0%, (2) Cu: 0.05-0.3%, (3) at least one element selected from In: at least 0.01% and less than 0.1%, Ni; 0.01-0.04%, Co: 0.01-0.05%, and Pt: 0.01-0.1%, optionally (4) at least one element selected from Sb, Bi, Fe, Al, Zn, and P in a total amount of up to 0.1%, and a remainder of Sn and impurities.

4 Claims, 1 Drawing Sheet

(56) References Cited

FOREIGN PATENT DOCUMENTS

| | | |
|---|---|---|
| JP | 2005046882 | 2/2005 |
| JP | 2005103645 | 4/2005 |
| JP | 2005246480 | 9/2005 |

OTHER PUBLICATIONS

Machine translation of JP 2001287082, 2001.*

* cited by examiner

LEAD-FREE SOLDER ALLOY

TECHNICAL FIELD

This invention relates to a lead-free solder alloy containing no lead and particularly to a lead-free solder alloy which is suitable for forming minute solder portions such as solder bumps.

BACKGROUND ART

Mounting of extremely small multifunctional semiconductor packages such as a BOA (ball grid array) and CSP (chip size package) on printed wiring boards is often carried out by means of solder bumps. When carrying out such mounting, solder bumps are previously formed atop the electrodes of a package, and the package is disposed so that the solder bumps contact the portions to be soldered (lands) of a printed wiring board. The printed wiring board and the package are then heated in a heating apparatus such as a reflow furnace and the bumps are melted to solder the package to the printed wiring board and to provide electrical continuity between the two member.

Solder bumps are also utilized for mounting of a bare chip to a printed wiring board. Such mounting is called DCA (direct chip attach) or flip chip method. In this method, solder bumps are formed atop the electrodes of a chip. Mounting of a chip on a printed wiring board by DCA Or also be carried out by wire bonding or TAB (tape automated bonding), but flip chip mounting enables higher density mounting as well as mounting with high productivity.

With a QFP (quad flat package), SOIC (small outline integrated circuit) and the like, connection of electrodes of a chip and a substrate (interposer) on which the chip is mounted has in recent years increasingly been carried out by flip chip connection using solder bumps instead of wire bonding, which was primarily used in the past. In the same manner as flip chip mounting, this connection method utilizes solder bumps formed on the electrodes of a chip.

Wire bonding uses expensive gold wire, and even though operation is automated and performed at a high speed, electrodes are connected one by one, so the operation takes an extended period of time. In addition, as the electrode density increases with an increase in the performance of chips, short circuits due to contact between wires has become unavoidable. In contrast, flip chip mounting or connection can be rapidly carried out by disposing a chip such that solder bumps formed on the chip come into contact with portions to be soldered of a printed wiring board or electrodes of a substrate and melting the solder bumps. In addition, short circuits due to contact of wires does not occur even if the electrode density increases.

Formation of solder bumps on electrodes of a package or a chip is typically carried out using solder balls or a solder paste.

A conventional solder alloy used for forming solder bumps was a Sn—Pb based solder alloy. A Sn—Pb based solder alloy has excellent solderability so that it can perform highly reliable soldering with minimized soldering defects even when it is used for soldering with minute solder bumps.

However, when printed wiring boards which are difficult to reuse are disposed of by burial, pollution of underground water with lead caused by contact of printed wiring boards with acid rain has become a problem. For this reason the use of Pb-containing solder alloys has come to be restricted on a worldwide scale. Therefore, development of lead-free solder alloys which do not contain Pb is promoted.

Lead-free solder alloys typically contain Sn as a main constituent element with one or more alloying elements such as Ag, Bi, Cu, Sb, In, Ni, and Zn added thereto. For example, binary alloys such as Sn—Cu, Sn—Sb, Sn—Bi, Sn—Zn, and Sn—Ag and various types of ternary or higher alloys having other elements added to these binary alloys have been proposed as lead-free solder alloys.

In general, the solderability of a Sn-based lead-free solder alloy is inferior compared to a conventional Sn—Pb based solder alloy. Among these lead-free solder alloys, Sn—Ag alloys have better solderability compared to other binary alloys, and they are also better with respect to other properties such as brittleness and alterations with time.

In so-called mobile electronic equipment such as mobile telephones, notebook computers, and digital cameras, soldered joints inside the electronic equipment need to have excellent impact resistance. Mobile electronic equipment can be subjected to impacts when dropped, and if soldered joints inside the electronic equipment break away as a result of such an impact, the equipment can no longer perform its intended function. One of major causes of malfunctions when mobile electronic equipment is dropped is breakaway of soldered joints. Lead-free solder alloys have the tendency to have lower impact resistance to dropping compared to Pb—Sn based solder alloys.

In particular, in BGA's and flip chip connection, impacts cannot be absorbed by lead wires as is the case with connection employing lead wires, and impacts are directly applied to soldered joints. Therefore, they are more sensitive to impacts caused by dropping. In addition, as chips become increasingly multifunctional, the electrode density of chips is increasing; and accordingly the size of solder bumps formed on electrodes is becoming minute. In light of these circumstances, it is desired that the impact resistance to dropping of lead-free solder alloys be improved in haste.

In JP 2002-307187A1 (Patent Document 1), a lead-free solder alloy comprising, in mass percent, 1.0-3.5% Ag, 0.1-0.7% Cu, 0.1-2.0% In, optionally one or more of 0.03-0.15% Ni, 0.01-0.1% Co, and 0.01-0.1% Fe, and a remainder essentially of Sn and unavoidable impurities is described as having good heat cycle resistance. The solder alloys shown in the examples all contain 3.0% Ag. There is no description concerning impact resistance to dropping.

In JP 2002-239780A1 (Patent Document 2), a lead-free solder alloy comprising, in mass percent, Ag: 1.0-2.0%, Cu: 0.3-1.5%, optionally one or more of Sb; 0.005-1.5%, Zn; 0.05-1%, Ni: 0.05-1%, and Fe: 0.005-0.5%, and a remainder of Sn and impurities is described as having excellent joint reliability and impact resistance to dropping.

In JP 2005-46882A1 (Patent Document 3), a solder alloy comprising, in mass percent, 0.1-5% Cu, 0.1-10% In, at least one element selected from Fe, Ni, and Co in a total amount of 0.002-0.05%, optionally 0.1-1.5% Ag, and a remainder of Sn and unavoidable impurities is described as having improved reliability with respect to fracture of joints due to impacts from dropping. The solder alloys shown in the examples all contain at least 1% In.

The solder alloys disclosed in Patent Document 1, such as a Sn-3.0% Ag-0.5% Cu-0.5% In-0.05% Ni solder alloy, for example, have low impact resistance to dropping. The Sn—Ag—Cu based lead-free solder alloys described in Patent Document 2 have insufficient impact resistance to dropping when used in the form of minute solder bumps.

The Sn—(Ag)—Cu—In—Ni/Co solder alloys described in Patent Document 3 contain a considerably large amount of In, and they have the problem of yellowing of solder. Quality inspection of minute solder bumps formed atop a substrate or chip is generally carried out by optical recognition. Heat treatment called burn-in may be applied to the substrate or chip before quality inspection. Yellowing of solder may interfere with optical recognition during quality inspection and be a cause of recognition errors. If errors occur during quality inspection of solder bumps, the reliability of soldering is markedly decreased. Moreover, In (indium) is easily oxidized, so a solder alloy containing a large amount of In increases the amount of oxidation during heating at the time of solder bump formation or soldering, and a large amount of voids form in the solder bumps or soldered joints, which has an adverse effect on impact resistance to dropping.

DISCLOSURE OF THE INVENTION

An object of the present invention is to provide a lead-free solder alloy having good solderability and having good impact resistance to dropping even in the form of minute soldered joints.

Another object of the present invention is to provide a lead-free solder alloy with which yellowing does not occur at the time of soldering and which suppresses the formation of voids in soldered joints after soldering.

The present inventors discovered that a Sn—Ag—Cu based lead-free solder alloy to which at least one of In, Ni, Co and Pt is added has excellent solderability and at the same time is effective in improvement with respect to impact resistance to dropping and suppression of yellowing of solder and formation of voids.

The present invention is a lead-free solder alloy consisting essentially of, in mass percent, (1) Ag: 0.8-2.0%, (2) Cu: 0.05-0.3%, (3) at least one element selected from In: at least 0.01% and less than 0.01%, Ni: 0.01-0.04%, Co: 0.01-0.05%, and Pt: 0.01-0.1%, and a remainder of Sn and impurities.

A preferred lead-free solder alloy according to the present invention contains Ni and In in the above-described amounts. Preferably, the Ag content is 0.8-1.2%, the Cu content is 0.05-0.2%, the Ni content is 0.01-0.03%, the In content is 0.01-0.08%, the Co content is 0.01-0.03%, and the Pt content is 0.01-0.05%.

A lead-free solder alloy according to the present invention exhibits good solderability and improved impact resistance to dropping even when it is used for soldering by means of minute bumps. Even when it contains In, the content of In is minimized, so yellowing of the solder alloy due to heating at the time of manufacture and processing of the solder alloy or heating at the time of solder bump formation or soldering is prevented, and the formation of voids in solder bumps or soldered joints is suppressed.

Accordingly, a lead-free solder alloy according to the present invention is suitable not only for mounting on printed wiring boards of packages such as BGA's and CSP's in which the size of solder bumps formed on electrodes is becoming increasingly small, but it can also be used to form solder bumps on chip electrodes which require an even smaller solder bump diameter.

BEST MODE FOR CARRYING OUT THE INVENTION

Figure 1:
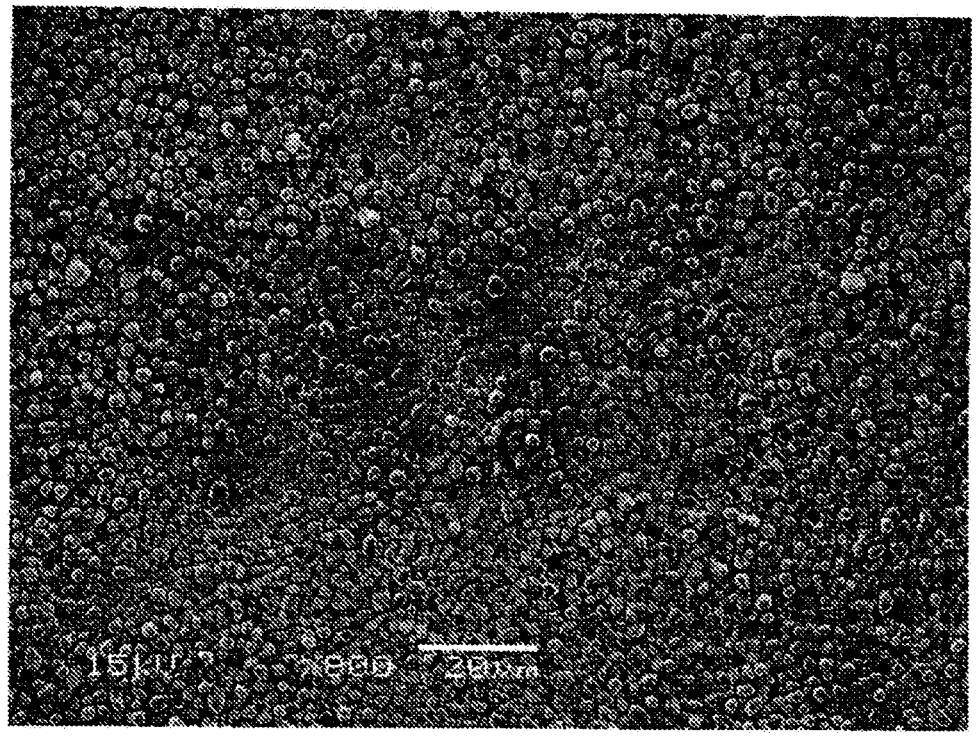
FIG. 1 is an electron photomicrograph viewed from the above of the surface of an intermetallic layer formed at the phase boundary of a solder bump from the solder alloy of Example 2 after thermal aging.

In the following explanation, percent with respect to the composition of a solder alloy means mass percent.

As described in above-mentioned Patent Document 1, iii an Sn-based lead-fee solder alloy, Ag is effective at providing resistance to heat cycles. However, addition of a large amount of Ag causes impact resistance to dropping to decrease.

The Ag content of a lead-free solder alloy according to the present invention is 0.8-2.0%. If the Ag content is smaller than 0.8%, resistance to heat cycles decreases. On the other hand, if the Ag content exceeds 2.0%, the impact resistance to dropping of the solder alloy decreases even if Ni, In, Co, and/or Pt which have an effect of improving impact resistance to dropping are added. A preferred Ag content is 0.8-1.2%, more preferably it is 0.9-1.1%, and most preferably it is approximately 1.0%.

A lead-free solder alloy according to the present invention contains 0.05-0.3% Cu. Cu has the effect of improving the wettability and therefore the solderability of a Sn-based lead-free solder alloy. If the Cu content is less than 0.05%, the melting point of the solder alloy increases and wettability worsens. If the Cu content is larger than 0.3%, it becomes easy for voids to form during heating at the time of solder bump formation or at the time of soldering, and impact resistance to dropping decreases. A preferred Cu content is 0.05-0.2%.

In addition to Ag and Cu, a lead-free solder alloy according to the present invention contains one or more alloying elements selected from In: at least 0.01% and less than 0.1%, Ni: 0.01-0.04%, Co: 0.01-0.05%, and Pt: 0.01-0.1%. When any of these elements is added in a small amount, it has the effect of markedly improving the impact resistance to dropping of a lead-free solder alloy and particularly the impact resistance to dropping after thermal aging. These effects are particularly marked when Ni and In are added. Accordingly, preferably at least Ni and In are added.

Impact resistance to dropping of a solder alloy after thermal aging is a desired property in actual use. In electronic equipment and particularly mobile electronic equipment such as mobile telephones and notebook computers, the electrodes and interconnecting lines formed on a substrate are very fine and hence have an increased resistivity, which leads to an increased heat generation. As a result, it is said that the temperature around a semiconductor chip reaches on the order of 100° C. Therefore, it is necessary for a solder alloy to evaluate its properties after thermal aging. If a solder alloy does not have good properties after thermal aging, equipment having soldered portions with the solder alloy has poor durability and hence poor practical performance.

It has been found that addition of a minute amount of In (indium), i.e., at least 0.01% of In is extremely effective at improving impact resistance to dropping after thermal aging. However, In is a metal which is easily oxidized, and it promotes the oxidation of a solder alloy. Particularly, if the In content is 0.1% or higher, it becomes easier for voids to develop in solder bumps or soldered joints. Furthermore, addition of In in a large amount causes yellowing of a solder alloy (which becomes a cause of errors in quality inspection of solder bumps by image recognition) to occur. Therefore, in the present invention, the In content is at least 0.01% and less than 0.1% The In content is preferably 0.01-0.08%.

Ni has the effect of suppressing growth of an intermetallic layer formed at the phase boundary (solder/base metal interface) during thermal aging (which layer is made of grains of an intermetallic compound formed by mutual diffusion of metals between the solder alloy and the underlying metal), particularly when the surface to be soldered is coated with Cu. Growth of the intermetallic layer and coarsening of the grains constituting the intermetallic layer at the phase boundary leads to a decrease in bonding strength and hence a decrease in impact resistance to dropping. The effect of Ni becomes significant when the Ni content is at least 0.01%. However, if the Ni content exceeds 0.04%, a further improvement is not observed, and it increases the liquidus temperature of a solder alloy, thereby making the soldering temperature high. Accordingly, the Ni content is 0.01-0.04% and preferably 0.01-0.03%.

Co has an effect like Ni, and for the same reasons as for Ni, it can be contained in a lead-free solder alloy according to the present invention in an amount of 0.01-0.05%. A preferred Co content is 0.01-0.03%.

If the content of Pt is less than 0.01%, the above-described effect is not obtained to a significant extent. Pt is expensive, so a content exceeding 0.1% is disadvantageous from an economic standpoint. A preferred Pt content is 0.01-0.05%.

In addition to the above-described elements, a lead-free solder alloy according to the present invention may contain one or more elements selected from Sb, Bi, Fe, Al, Zn, and P. These elements have the effect of increasing mechanical strength of the alloy, but this effect is not realized significantly if the total amount is less than 0.01%. On the other hand, if the total amount thereof exceeds 0.1%, the liquidus temperature of the alloy becomes too high or the solidus temperature thereof becomes too low, and it becomes difficult to control the soldering temperature. Accordingly, when these elements are added, their total amount is made 0.01-0.1%.

The remainder of a lead-free solder alloy according to the present invention is essentially Sn and impurities. The soldering temperature of a solder alloy having the above-described composition is usually in the range of 235-250° C.

In view of its excellent impact resistance to dropping, a lead-free solder alloy according to the present invention is suitable for forming solder bumps on a substrate of a semiconductor package or on a chip which is mounted on a package or which is mounted in a bare state. Formation of solder bumps can be carried out in a conventional manner using a solder paste or solder balls. In the case of solder balls, the diameter of the balls can be in the range of 0.05-0.8 mm.

When a lead-free solder alloy according to the present invention is heated in a reflow furnace or the like in order to form solder bumps or to perform soldering, heating may be carried out in a nitrogen atmosphere in order to prevent oxidation of the alloy, but an adequate impact resistance to dropping can be obtained even when heating is performed in air, which is advantageous from a cost standpoint.

EXAMPLES

Solder balls having a diameter of 0.3 nun were prepared from the solder alloys having the compositions shown in Table 1. Among the solder alloys shown as comparative examples in Table 1, Comparative Examples 1 and 2 illustrate solder alloys having representative compositions described in Patent Documents 1 and 2, respectively. Comparative Examples 3 and 5 illustrate solder alloys described in Patent Document 3.

Using the solder balls, impact resistance to dropping before and after thermal aging, the thickness of an intermetallic layer measured after thermal aging, yellowing discoloration caused by heating, and the formation of voids were tested by the methods described below. The results are also shown in Table 1. Heating in a reflow furnace or a thermostatic oven in each test was carried out in air.

[Impact Resistance to Dropping]

(1) Flux is applied by printing to the electrodes of a CSP measuring 12×12 mm and having 192 electrodes (the surfaces of which were plated with copper), and a solder ball to be tested having a diameter of 0.3 mm is placed on each electrode.

(2) The CSP having solder balls mounted thereon is heated in a reflow furnace to form solder bumps on the electrodes. The heating conditions are 40 seconds for which the temperature is 220° C. or above with the peak temperature of 245° C.

(3) The CSP having solder bumps thereon is mounted on the center of a glass epoxy printed wiring board measuring 30×120 (mm), and the CSP is soldered to the printed wiring board by heating in a reflow furnace. The heating conditions are the same as above.

(4) The printed wiring board having the CSP soldered thereon is either held for 5 days at room temperature (for a test before thermal aging) or is heated for 100 hours in a thermostat oven at 125° C. (for a test after thermal aging), and then it is secured to a dropping jig in order to subject it to a dropping test. The printed wiring board is secured at both of its ends to the jig with a separation from the jig of 1 cm. A test is performed on a soldered joint also after thermal aging because in the operating environment of mobile equipment, there are cases in which the interior of the equipment reaches a high temperature of around 100° C. as described above.

(5) The dropping jig is dropped from a height of 450 mm to impart an impact to the printed wiring board. At this time, the center portion of the printed wiring board which has both ends secured to the jig vibrates, so an impact is imparted by this vibration to the soldered joints between the printed wiring board and the CSP. It is ascertained by electrical continuity whether there are cracks in the soldered joints after dropping. The dropping test is repeated until cracks develop in the soldered joints of the CSP, and the impact resistance to dropping is evaluated by the number of times dropping is performed until cracks develop.

[Thickness of Intermetallic Layer after Thermal Aging]

(1) Flux is applied by printing to the electrodes of a CSP measuring 12×12 mm and having 192 copper-plated electrodes, and a solder ball with a diameter of 0.3 mm is placed atop each electrode.

(2) The CSP having solder balls mounted thereon is heated in a reflow furnace under heating conditions including a temperature of at least 230° C. for 20 seconds with a peak temperature of 240° C. for 5 seconds to form a solder bump on each electrode.

(3) The CSP on which solder bumps are formed is left for 100 hours in a thermostat oven at 150° C. to perform thermal aging. The thermal aging causes an intermetallic layer to form at the solder/CSP interface (phase boundary) by mutual dif fusion of metal elements in the solder bumps and the surface Cu plating of the CSP.

(4) The CSP which has been subjected to thermal aging is embedded in a resin, and a cross section which is formed by cutting the resin-embedded CSP in a direction along the thickness of its substrate so as to pass through solder bumps is polished to give a specimen for observation.

(5) The phase boundary between a solder bump and the CSP of the polished cross section is observed with a scanning electron microscope, and the thickness of the intermetallic layer formed at the phase boundary is measured at 30 locations. The evaluation is made by the average thickness at the 30 locations.

Figure 2:
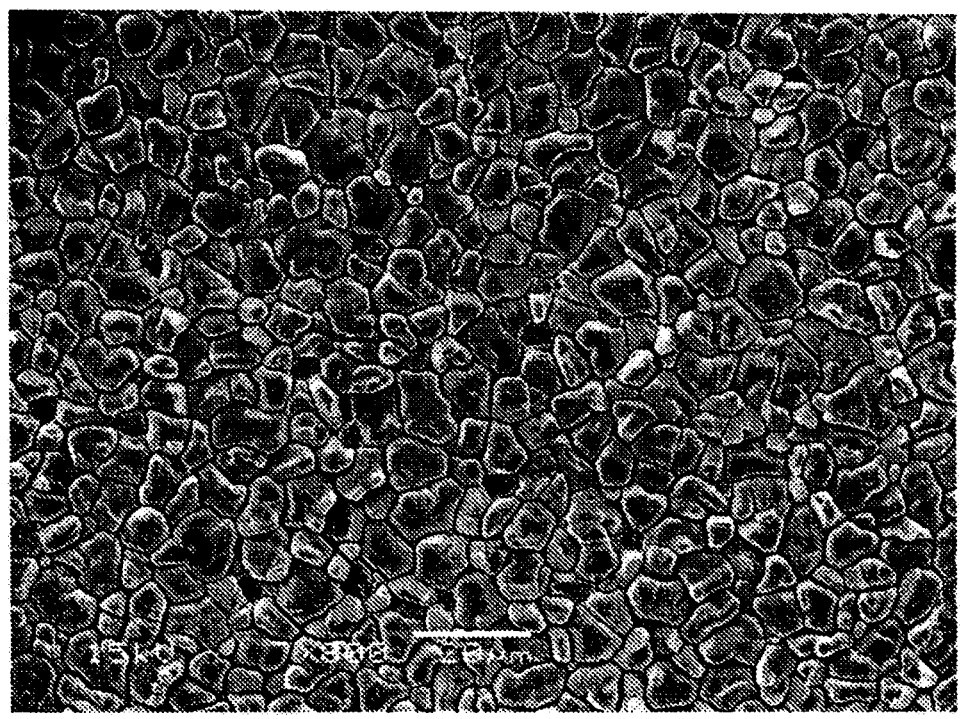
FIG. 2 is an electron photomicrograph viewed from the above of the surface of an intermetallic layer formed at the phase boundary of a solder bump from the solder alloy of Comparative Example 4 after thermal aging.

FIGS. 1 and 2 show electron photomicrographs of intermetallic layers, when viewed from the above, formed at the phase boundaries of solder bumps made from solder alloys of Example 2 and Comparative Example 4, respectively. The samples which were viewed were made by subjecting a CSP on which solder bumps were formed to chemical etching so as to remove solders and reveal the intermetallic layer formed beneath the solder bumps. The surface of one of the revealed intermetallic layers was observed under an electron microscope.

[Yellowing]

(1) In the same manner as described above, solder balls with a diameter of 0.3 mm are mounted on a CSP.

(2) The solder balls mounted on the CSP are melted in a reflow furnace under the same conditions as in the test for thickness of intermetallic layer to form solder bumps.

(3) The CSP on which solder bumps are formed is left for 100 hours in a thermostat oven at 125° C. in order to simulate "burn-in", and then the state of yellowing is visually observed. Specimens having substantially no yellowing were considered as not having yellowing, and those having marked yellowing are considered as having yellowing.

[Occurrence of Voids]

(1) In the same manner as described above, solder balls having a diameter of 0.3 mm are mounted on a CSP.

(2) The solder balls mounted on the CSP are melted in a reflow furnace in the same manner as described above to form solder bumps.

(3) The CSP having solder bumps formed thereon is observed with an X-ray transmission apparatus, and the number of bumps which developed voids with a diameter of at least 30 micrometers is counted.

(4) The % occurrence of voids was obtained by dividing the number of bumps in which voids occurred by the number of observed bumps. A void occurrence of 10% or less is considered to be good.

TABLE 1

| | Composition of Solder Alloy (mass %) | | | | | | | Impact resistance to dropping (number of times of dropping) | | Thickness of intermetallic layer (nm) | Yellowing | Voids (%) |
|---|---|---|---|---|---|---|---|---|---|---|---|---|
| | Sn | Ag | Cu | Ni | In | Co | Pt | Before aging | After aging | | | |
| Example 1 | Bal. | 1 | 0.05 | 0.01 | 0.01 | | | 200 | 55 | 3.4 | No | 5 |
| Example 2 | Bal. | 1 | 0.1 | 0.03 | 0.03 | | | 153 | 40 | 3.2 | No | 8 |
| Example 3 | Bal. | 1.2 | 0.1 | 0.02 | 0.02 | | | 182 | 50 | 3.2 | No | 4 |
| Example 4 | Bal. | 0.8 | 0.2 | 0.03 | 0.03 | | | 160 | 43 | 3.1 | No | 4 |
| Example 5 | Bal. | 0.8 | 0.2 | | 0.03 | | | 201 | 45 | 3.1 | No | 4.2 |
| Example 6 | Bal. | 0.8 | 0.2 | | 0.03 | 0.02 | | 187 | 43 | 3.9 | No | 4.5 |
| Example 7 | Bal. | 2 | 0.1 | 0.02 | | 0.02 | 0.02 | 158 | 46 | 3.1 | No | 1.1 |
| Example 8 | Bal. | 2 | 0.1 | 0.02 | | | 0.05 | 185 | 59 | 2.4 | No | 2.1 |
| Comp. Ex. 1 | Bal. | 3 | 0.5 | 0.05 | 0.5 | | | 95 | 31 | 4.5 | No | 15 |
| Comp. Ex. 2 | Bal. | 1 | 0.5 | | 0.5 | | | 142 | 27 | 4.2 | No | 14 |
| Comp. Ex. 3 | Bal. | 1 | 0.5 | 0.02 | 0.5 | | | 168 | 36 | 3.5 | No | 18 |
| Comp. Ex. 4 | Bal. | 3 | 0.5 | | | | | 84 | 31 | 4.5 | No | 17 |
| Comp. Ex. 5 | Bal. | 2 | 0.2 | 0.1 | 1 | | | 98 | 38 | 3.4 | Yes | 45 |
| Comp. Ex. 6 | Bal. | 2 | 0.5 | | | | | 105 | 25 | 5 | No | 12 |

As can be seen from Table 1, lead-free alloys in the comparative examples generally had poor impact resistance to dropping, in particular after thermal aging. The solder alloy in Comparative Example 3 had good impact resistance to dropping before thermal aging, but after thermal aging, its impact resistance to dropping became much inferior to solder alloys according to the present invention. A main cause thereof is considered to the fact that the thickness of the intermetallic layer measured after thermal aging was greater than that of a solder alloy according to the present invention. Furthermore, the occurrence of voids far exceeded 10% in all the solder alloys of the comparative examples. In addition, in the solder alloy of Comparative Example 5 in which the In content was particularly high, yellowing was observed after thermal aging.

In contrast, a lead-free solder alloy according to the present invention had good impact resistance to dropping both before and after thermal aging. This is considered to be attributable to the decreased thickness of the intermetallic layer measured after thermal aging. In addition, not only did the occurrence of voids decrease, but there was no yellowing. Accordingly, a lead-free solder alloy according to the present invention is suitable for forming solder bumps for minute soldered joints.

As can be seen by comparison of FIG. 1 (Example 2) and FIG. 2 (Comparative Example 4), in the case of a solder alloy according to the present invention (FIG. 1), the grain size of the intermetallic compound by which the intermetallic layer is constituted is much smaller. This is considered to also contribute to the fact that a decrease in impact resistance to dropping due to the formation of an intermetallic layer at the phase boundary is suppressed in a solder alloy according to the present invention.

The invention claimed is:

1. A lead-free solder alloy consisting of, in mass percent, Ag: 0.8-2.0%, Cu: 0.05-0.3%, In: 0.01-0.08%, Ni: 0.01-0.04%, and a remainder of Sn and impurities.

2. A lead-free solder alloy as claimed in claim 1 which contains 0.8-1.2% of Ag.

3. A lead-free solder alloy as claimed in claim 1 which contains 0.05-0.2% of Cu.

4. A lead-free solder alloy as claimed in claim 1 which contains 0.01-0.03% of Ni.

\* \* \* \* \*